US011187766B1

(12) United States Patent
Zhang et al.

(10) Patent No.: US 11,187,766 B1
(45) Date of Patent: Nov. 30, 2021

(54) METHODS AND SYSTEMS FOR DETERMINING FLUID CONTENT IN FORMATION SAMPLES USING LOW FIELD NUCLEAR MAGNETIC RESONANCE

(71) Applicant: Saudi Arabian Oil Company, Dhahran (SA)

(72) Inventors: Jilin Jay Zhang, Cypress, TX (US); Jin-Hong Chen, Katy, TX (US); Stacey Marie Althaus, Houston, TX (US)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 16/924,984

(22) Filed: Jul. 9, 2020

(51) Int. Cl.
*G01R 33/30* (2006.01)
*G01N 24/08* (2006.01)
*G01R 33/34* (2006.01)

(52) U.S. Cl.
CPC .......... *G01R 33/307* (2013.01); *G01N 24/08* (2013.01); *G01R 33/34092* (2013.01)

(58) Field of Classification Search
CPC . G01R 33/307; G01R 33/34092; G01N 24/08
See application file for complete search history.

(56) References Cited

U.S. PATENT DOCUMENTS

| 4,564,811 | A | 1/1986 | Walker |
| 4,719,423 | A | 1/1988 | Vinegar et al. |
| 5,387,865 | A | 2/1995 | Jerosch-Herold et al. |
| 5,850,623 | A | 12/1998 | Carman, Jr. et al. |
| 6,462,542 | B1 | 10/2002 | Venkataramanan et al. |
| 6,522,138 | B2 | 2/2003 | Heaton |
| 6,597,171 | B2 | 7/2003 | Hurlimann et al. |
| 7,397,240 | B2 | 7/2008 | Fleury et al. |
| 9,851,315 | B2 | 12/2017 | Yang et al. |
| 2006/0272812 | A1 | 12/2006 | Yu et al. |

(Continued)

FOREIGN PATENT DOCUMENTS

CN 104122285 A 10/2014

OTHER PUBLICATIONS

Chang, Chii-Tzong et al.; "The Use of Agarose Gels for Quantitative Determination of Fluid Saturations in Porous Media" Magnetic Resonance Imaging, vol. 11, 1993; pp. 717-725.

(Continued)

*Primary Examiner* — G. M. A Hyder
(74) *Attorney, Agent, or Firm* — Bracewell LLP; Constance G. Rhebergen; Vivek P. Shankam

(57) ABSTRACT

Methods and systems for determining fluid content in a formation sample are disclosed. The method includes disposing the formation sample with a standard sample of a known chemical composition and one or more nuclear magnetic resonance (NMR) attributes in a NMR coil or probe, and acquiring NMR signals for the formation sample and the standard sample simultaneously. The system includes a NMR probe or NMR coil, a formation sample, and a standard sample with known chemical composition and one or more nuclear magnetic resonance (NMR) attributes, wherein the formation sample and the standard sample are disposed in the NMR coil or probe, and wherein NMR signals are acquired for the formation sample and the standard sample simultaneously.

10 Claims, 6 Drawing Sheets

(56) References Cited

U.S. PATENT DOCUMENTS

| | | |
|---|---|---|
| 2012/0241149 A1 | 9/2012 | Chen et al. |
| 2018/0102240 A1 | 4/2018 | Bromage et al. |
| 2018/0217073 A1* | 8/2018 | Chen .................... G01R 33/246 |

OTHER PUBLICATIONS

International Search Report and Written Opinion for International Application No. PCT/US2021/070855, dated Oct. 7, 2021; pp. 1-15.

Straley, Christian et al.; "Core Analysis by Low Field NMR" SCA-9404, Mar. 1, 1997; pp. 43-56.

Xu, Hao et al.; "A precise measurement method for shale porosity with low-field nuclear magnetic resonance: A case study of the Carboniferous-Permian strata in the Linxing area, eastern Ordos Basin, China" Fuel 143 (2015); pp. 47-54.

Zhang, Weiwei et al.; "A study on pore systems of Silurian highly mature marine shale in Southern Sichuan Basin, China" Journal of Natural Gas Science and Engineering 76 (2020) 103094; pp. 1-16.

\* cited by examiner

METHODS AND SYSTEMS FOR DETERMINING FLUID CONTENT IN FORMATION SAMPLES USING LOW FIELD NUCLEAR MAGNETIC RESONANCE

TECHNICAL FIELD

Embodiments relate to systems and methods for measuring properties of subsurface formations, and more specifically to systems and methods for measuring fluid content in formation samples using low field nuclear magnetic resonance ("NMR").

BACKGROUND

The properties of fluid in porous media are of great relevance in many fields of science and engineering. There are numerous measurements which bear some importance on characterizing fluid properties in confined geometries like sandstone rocks, including porosity, fluid flow permeability, electrical conductivity, wettability, etc. Quantities like porosity and fluid flow permeability in porous rocks are of great relevance for determining the productivity of petroleum reservoirs.

For porous media it has become customary to speak of the solid material which forms the "backbone" as the matrix and its complement as the pore space. Porosity is defined as the ratio of pore space volume inside the porous material to the total volume of the porous medium. Permeability is a measure for the ability of porous materials, e.g. porous rocks, to permit fluid flow through the pore space. It generally increases with porosity, but also depends on other parameters of the rocks, e.g. the specific surface area of the pore space, the pore size distribution, and the pore shape. Therefore, porosity is an important parameter 1) that can help engineers estimate the capacity of the rock medium of storing fluid, and to estimate the economic reserves if the fluids inside the pore space can be properly identified, and 2) that can affect the calculation of the permeability.

Nuclear magnetic resonance (NMR) has been employed for some time to study the fluids inside the pore space of porous media. The fluid supplies numerous atoms or molecules in the pore space, and these molecules or atoms, when the external electro-magnetic field is carefully applied to them, would generate electrical signals in a sensing probe. Nuclear spin relaxation can provide information about the pore space geometry, for example, the case of $T_1$ and $T_2$ relaxation in an isolated pore where the nuclear spins are relaxed by collisions with the pore walls and collision among the atoms or molecules.

NMR has long been applied in well-bore environments to determine the properties of fluid carrying earth formations. This interest was further spurred by the introduction of a new generation of NMR logging tools by NUMAR (now Halliburton) over two decades ago. It is now known that nuclear magnetic resonance (NMR) techniques may be used to ascertain information regarding fluids contained within a porous medium. Advantageously, using NMR techniques offers a non-intrusive means for determining in-situ wettability of fluids in reservoir rocks, i.e., the NMR measurement process does not interfere with the fluid distribution within the pores of the rock. Hence, NMR techniques may be applied to monitor ongoing dynamic processes comprising wettability alteration, such as, ageing and secondary or tertiary oil recovery processes.

Proton NMR techniques may be particularly well suited for studies of fluids containing water and hydrocarbon phases, e.g. water and oil, within a porous medium. NMR spectroscopy may be used to measure the spin-lattice (longitudinal) relaxation time ($T_1$) and/or the spin-spin (transverse) relaxation time ($T_2$) of the fluid. For instance, Proton NMR spectroscopy measures the relaxation time for protons within the fluid. From these measurements it may be possible to elucidate certain information concerning the fluid and/or the porous medium.

For instance, core samples may be taken for subsequent analysis using land-based NMR equipment, either at a drilling site or in a laboratory. Alternatively, NMR logging tools may advantageously be deployed downhole. Such tools typically employ so-called low field spectroscopy.

Both the land-based NMR equipment and the NMR logging tools are calibrated at a certain condition (hereinafter referred to as "calibration condition"); whereas the conditions during real NMR measurements (hereinafter referred to as "measurement condition") can be drastically different from the calibration condition. The discrepancy between the measurement conditions and the calibration condition would result in inaccurate measurements of the porosity of the rock media, which are not desired by the engineers. There may be many types of computational corrections to remove the effect on the measurement results due to this discrepancy.

SUMMARY

Accordingly, the present disclosure provides a simple, reliable, method and system to address the discrepancy and to generate more accurate measurement results on the fluid-filled porosity of any porous medium, including subsurface formations. The method, according to one embodiment, can be carried out with a nuclear magnetic resonance (NMR) tool to measure the longitudinal and/or transverse relaxation time of the fluids saturating a subsurface formation to accurately predict the porosity of the subsurface formation.

Some embodiments relate to systems and methods for measuring properties of subsurface formations, and more specifically to systems and methods for measuring fluid content more accurately in formation samples using low field nuclear magnetic resonance ("NMR") to overcome the discrepancy between the calibration condition and measurement condition.

One example embodiment is a method for determining the fluid inside the pores by measuring the rock medium and a carefully selected standard concurrently for a land-based NMR equipment in a laboratory. More specifically, one embodiment is a method for determining fluid content in a formation sample using low field nuclear magnetic resonance. The method includes disposing the formation sample with a standard sample of a known chemical composition and one or more nuclear magnetic resonance (NMR) attributes in a NMR coil or probe. The method further includes acquiring NMR signals for the formation sample and the standard sample simultaneously. The method further includes determining fluid content in the formation sample ($V_r$) using the formula:

$$V_r = \frac{V_{st}}{M_{st}} M_r$$

where $M_{st}$ is the NMR signal of the standard sample with known fluid volume ($V_{st}$) and $M_r$ is the NMR signal of the formation sample.

According one embodiment, the NMR attributes of the standard sample may be distinct but not too far from the NMR attributes of the formation sample. The standard sample may be prepared with different relaxation times by dissolving different amounts of paramagnetic relaxation agents into water. The amount of fluid in the standard sample may be comparable in intensity to the largest peak in the formation sample. During NMR signal acquisition, the interscan delay is long enough so that formation sample and the standard sample have established equilibrium before each scan.

Another example embodiment is a system for determining fluid content in a formation sample. The system includes a NMR probe or NMR coil, a formation sample, and a standard sample with known chemical composition and one or more nuclear magnetic resonance (NMR) attributes. The formation sample and the standard sample are disposed in the NMR coil or probe. The NMR signals are acquired for the formation sample and the standard sample simultaneously, and the fluid content in the formation sample ($V_r$) is determined using the formula:

$$V_r = \frac{V_{st}}{M_{st}} M_r$$

where $M_{st}$ is the NMR signal of the standard sample with known fluid volume ($V_{st}$) and $M_r$ is the NMR signal of the formation sample.

BRIEF DESCRIPTION OF THE DRAWINGS

All aspects and features of certain example embodiments of the present disclosure will be more apparent from the following description taken in conjunction with the accompanying drawings, in which.

DETAILED DESCRIPTION

Figure 1:
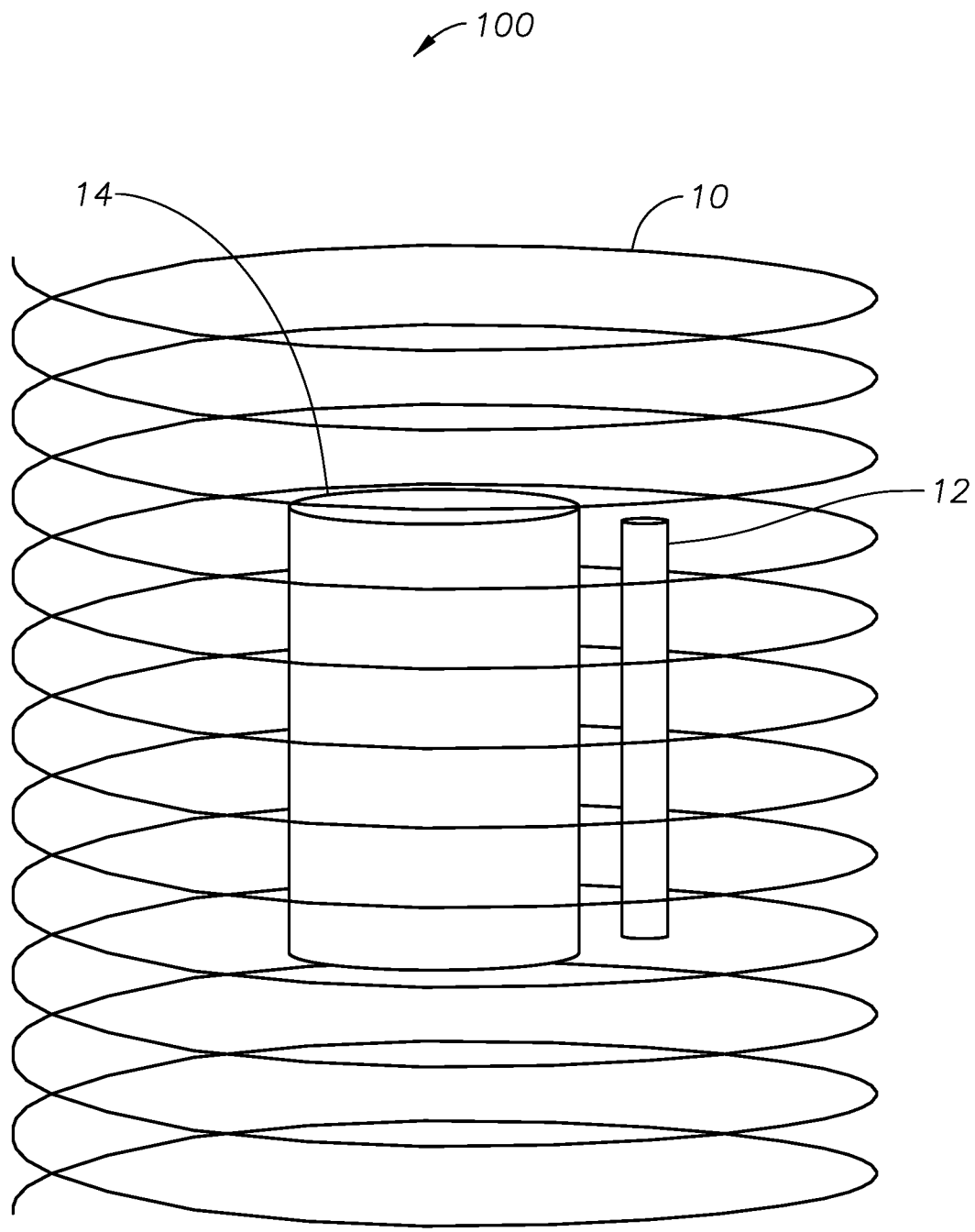
FIG. 1 illustrates an example system for determining fluid content in a formation sample using low field nuclear magnetic resonance, according to one example embodiment of the disclosure.

The particulars shown here are by way of example and for purposes of illustrative discussion of the examples of the subject disclosure only, and are presented in the cause of providing what is believed to be the most useful and readily understood description of the principles and conceptual aspects of the subject disclosure. In this regard, no attempt is made to show more detail than is necessary, the description taken with the drawings making apparent to those skilled in the art how the several forms of the subject disclosure may be embodied in practice. Furthermore, like reference numbers and designations in the various drawings indicate like elements.

Low magnetic field nuclear magnetic resonance (NMR) has been widely used to measure fluid content and distribution in rock samples. It has been further expanded into more complex NMR measurements, such as two-dimensional (2D) relaxation-relaxation and/or relaxation-diffusion experiments, were used to perform fluid typing to obtain fluid saturation in the samples. All these measurements rely on a basic requirement: the fluid content in the sample must be accurately determined.

Accordingly, one embodiment is a method for determining fluid content in a formation sample using low field nuclear magnetic resonance including using a calibration procedure with a standard sample, for example a water sample of known quantity, to obtain the response of the NMR to the fluid (also called the "internal standard" method). The rock sample can then be measured to determine the fluid content, from one single experiment instead of two NMR measurements/experiments. In the two NMR measurements/experiments method, the first measurement is done on the standard sample to acquire the NMR signal $M_{st}$ for the known fluid volume $V_{st}$. The second experiment is conducted on the rock sample to obtain the NMR signal $M_r$. In either one single experiment method or two experiments method, the fluid in the rock $V_r$ is then determined using the formula:

$$V_r = \frac{V_{st}}{M_{st}} M_r \qquad (1)$$

Standard samples generally have only one single peak and thus $M_{st}$ represents the total NMR signal. The measured NMR signal in a rock sample $M_r$ is generally a distribution of relaxation times or diffusion coefficients, a manifestation of combined effects from more than one fluid in rock pores of different size and pore surface properties. In addition, different NMR acquisitions or pulse sequences may generate different distributions. In Eq. (1), $M_r$ represent any distributions from the NMR measurement, accordingly, $V_r$ represents the fluid distribution of the rock sample. An integration over the distribution $M_r$ gives the total NMR signal and over $V_r$ gives the total fluid in the rock.

The above calibration method, using two experiments, is called the "external standard" method. This method assumes the NMR instrument is sufficiently stable so that the measured results in one experiment would be reproducible in the second subsequent experiment.

Many factors influence the stability of the NMR instrument. As a result, the measured NMR signals often vary more than 10% in repeated measurements. In this case, the routinely used external standard method generates significant errors. NMR instrument instability can come from multiple sources, including temperature instability, for example. Multiple sources can cause temperature instability. First, room temperature in some laboratories can vary more than 10° C. during a long experiment, which affects the performance of all the instrument parts and electronics. Second, the sample temperature may vary from the probe temperature. The sample may heat up or cool down during acquisition leading to fluctuations in the measurement. Third, during the NMR data acquisition, adsorption of radio-frequency (rf) power from the NMR experiment by the sample also changes the sample temperatures. This phenomena is known as rf-heating.

Another factor affecting NMR instrument stability is the idle rf signal that can be picked up by the NMR sensor or the amplifier. A majority of NMR laboratories are not isolated from other instruments and thus rf waves from these other instruments may be picked up by the NMR detection coil or signal amplifier.

In addition, in some NMR instruments, especially old ones, the electronic parts do not perform a stable manner. As a results, quite often the measured NMR signals vary more than 10% in repeated measurements. In this case, the external standard method does not work well because it operates under the assumption that the measurement from the first experiment would be the same as the second experiment.

FIG. 1 illustrates an example system 100 for determining fluid content in a formation sample 14 using low field nuclear magnetic resonance, according to one example embodiment of the disclosure. FIG. 1, for example, is an illustration of an internal standard sample 12 for NMR measurement to achieve accurate fluid quantification. The formation sample 14 and the internal standard sample 12 are disposed in the NMR rf coil 10 that sends and receives rf signals. A calibration method using an internal standard sample 12 to quantify fluid in rock samples 14 is used here. In this method, the internal standard sample 12 is placed with the core sample 14 in the NMR probe 10, as illustrated in FIG. 1. The NMR signal is acquired simultaneously for both samples. Any instrument instability would affect both samples in the same manner. As a result, we can use Eq. (1) to obtain the accurate fluids in the formation sample 14, free from the influence of the instrument instability.

The standard sample has to meet some requirements for this method. For example, the NMR signal from the standard sample must be clearly separated from the NMR signals from the rock fluid in the NMR relaxation spectrum. The NMR relaxation times of the fluids in the rocks is generally much shorter than in pure bulk fluids due to the pore surface relaxation. It is easy to prepare a standard sample with the relaxation time longer than the longest relaxation time of the fluids in the rock samples. It is also beneficial to have the relaxation time of the standard sample as short as possible so that the NMR data acquisition time is short thereby preventing too much rf heating to the testing sample. For this consideration, this method is especially useful for tight rocks such as shales where the relaxation time of shale fluids are short. The standard sample can be prepared with different relaxation times by dissolving different amount of paramagnetic relaxation agent into water. It is also possible to find fluids with the desired relaxation time and known chemical composition that meet the requirements listed above.

Secondly, the amount of fluid in the standard sample should be comparable in intensity to the largest peak in the rock samples to prevent any cause of bias during data inversion. This can be easily achieved by controlling the fluid quantity in the standard.

Next, during NMR data acquisition, the inter-scan delay must be long enough so that both samples can establish equilibrium before each scan. One also needs to acquire sufficient signal so that the inversion will easily separate the signals of the standard sample from the signal of the fluids in the formation sample in the NMR spectrum; however, this does not necessarily mean the full decay of the standard sample needs to be acquired. Considering these factors, multiple standards may be prepared in advance which contain different fluid amounts with different relaxation times to suit a variety of experiments.

Figure 2:
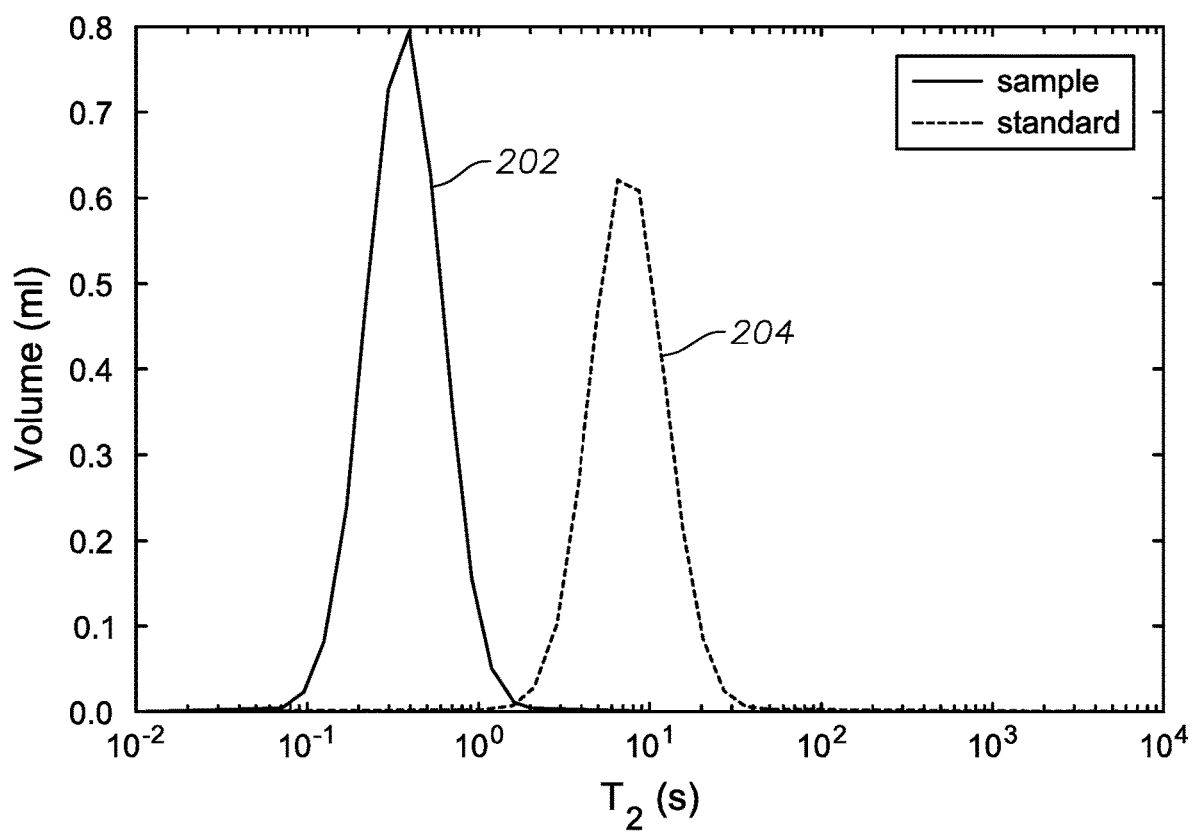
FIG. 2 illustrates example $T_2$ graphs for the formation sample and standard sample where their NMR signals are largely separable with little overlap, according to one example embodiment of the disclosure.

FIG. 2 illustrates example $T_2$ distribution graphs for the formation sample 202 and standard sample 204 where their NMR signals are largely separable with little overlap, according to one example embodiment of the disclosure. As explained above, the method includes scanning the sample(s) using the desired NMR pulse sequence to identify the NMR attributes of interest(s), e.g., $T_2$ or $T_1$, of the sample(s). The method further includes finding or preparing a standard with a $T_2$ distribution spectrum 204 with known chemical composition and NMR attributes of interest(s), clearly distinct but not too far from, those in the formation sample 202.

FIG. 2 shows an example of a sample's and a standard's $T_2$ distribution where they are clearly separable but not too far from each other. In FIG. 2, the amounts of the sample and standard should be on the same magnitude and their signals are largely separable, i.e. with little overlap.

According to this method, the total volume of the internal standard should produce a signal on the same order of magnitude as the signal from the sample(s). Then the exact amount of the fluid can be determined using the formula:

$$V_r = \frac{V_{st}}{M_{st}} M_r \qquad (2)$$

where V stands for the amounts of detectable fluid, M stands for the NMR signal strength, subscripts st stands for the standard, r for the rock sample, the amounts of detectable fluids may need correction using the chemical composition, such as hydrogen index, in the case that proton is the sensing element, and $V_{st}$ is a known amount of volume.

Figure 3:
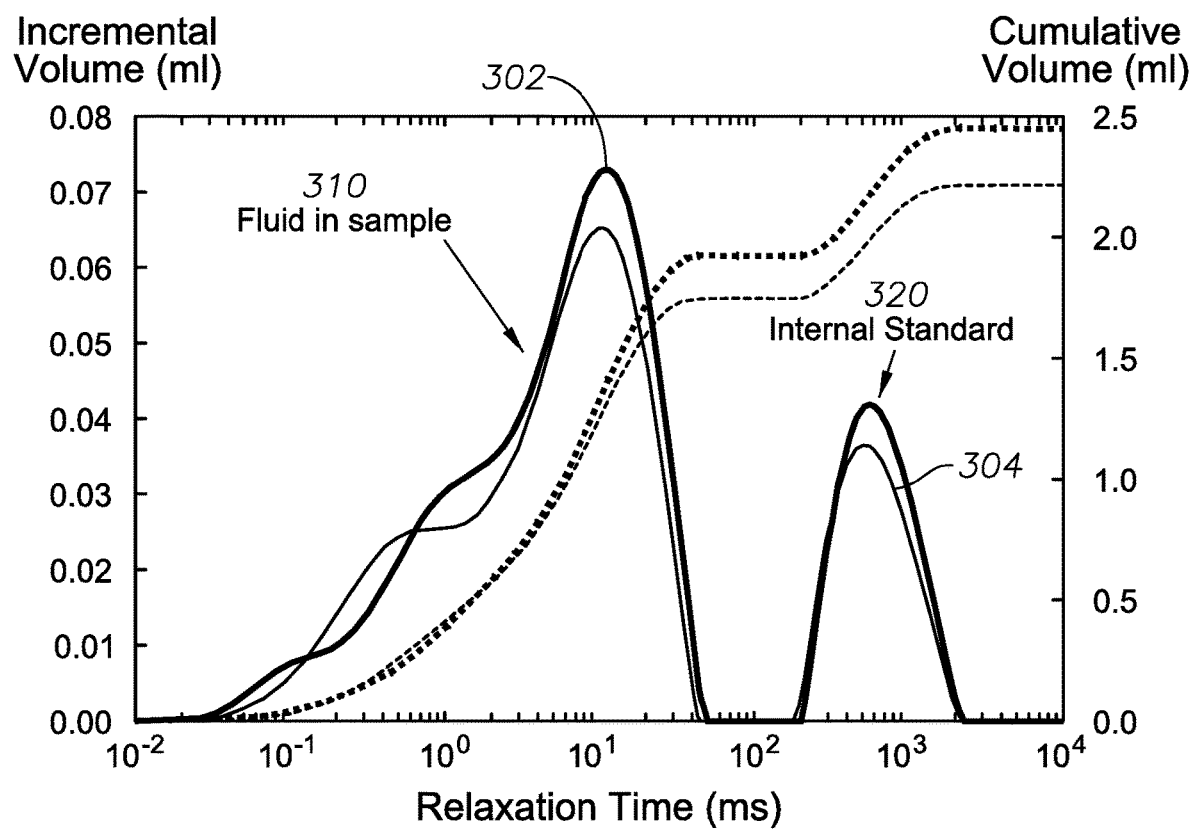
FIG. 3 illustrates example NMR $T_2$ spectra of an organic-rich shale and a standard sample containing 0.52 ml water doped with $CuSO_4$, according to one example embodiment of the disclosure.

FIG. 3 illustrates example NMR $T_2$ spectra of an organic-rich shale sample 310 and a standard sample 320 containing 0.52 ml water doped with $CuSO_4$, according to one example embodiment of the disclosure. More specifically, spectrum 302 and spectrum 304 were acquired in two different measurements, in that spectrum 302 shows respective curves from the first experiment and spectrum 304 shows respective curves from the second experiment. As seen here, the $T_2$ distributions, i.e. the NMR signals, have significant differences between the two measurements. The internal standard sample 320 has 0.52 ml of water doped with $CuSO_4$ sealed in a glass tube. The standard sample 310 has a transverse relaxation time $(T_2)$ of approximately 600 ms, whereas the maximum $T_2$ of the formation sample 310 is about 40 ms. FIG. 3 shows that in two experiments (302, 304), both $T_2$ distributions of the fluids from the formation sample 310 and from the same standard sample 320 changes. However, using the pre-known amount of fluids in the standard sample 320, Eq. (1) can be used to obtain the fluid in the formation sample 310 accurately for each measurement.

Figure 4A:
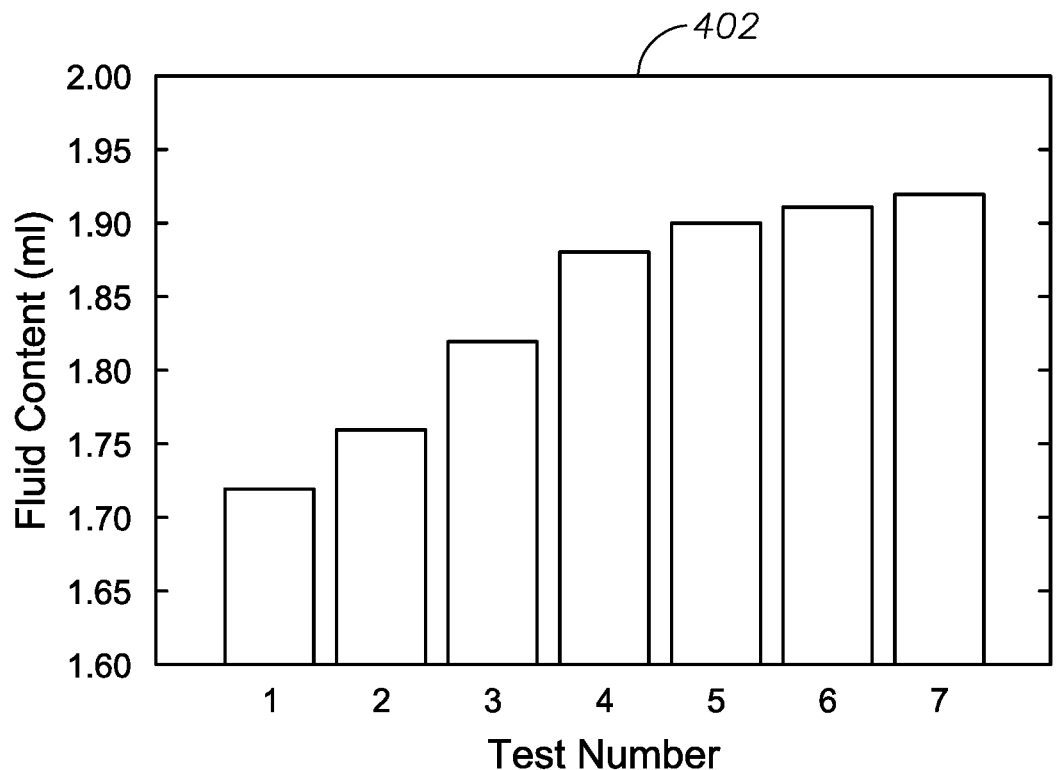
FIGS. 4A and 4B illustrate total fluid content in the organic-rich shale sample using external (FIG. 4A) and internal (FIG. 4B) standard from seven different measurements on the formation sample and standard sample, according to some example embodiments of the disclosure.
Figure 4B:
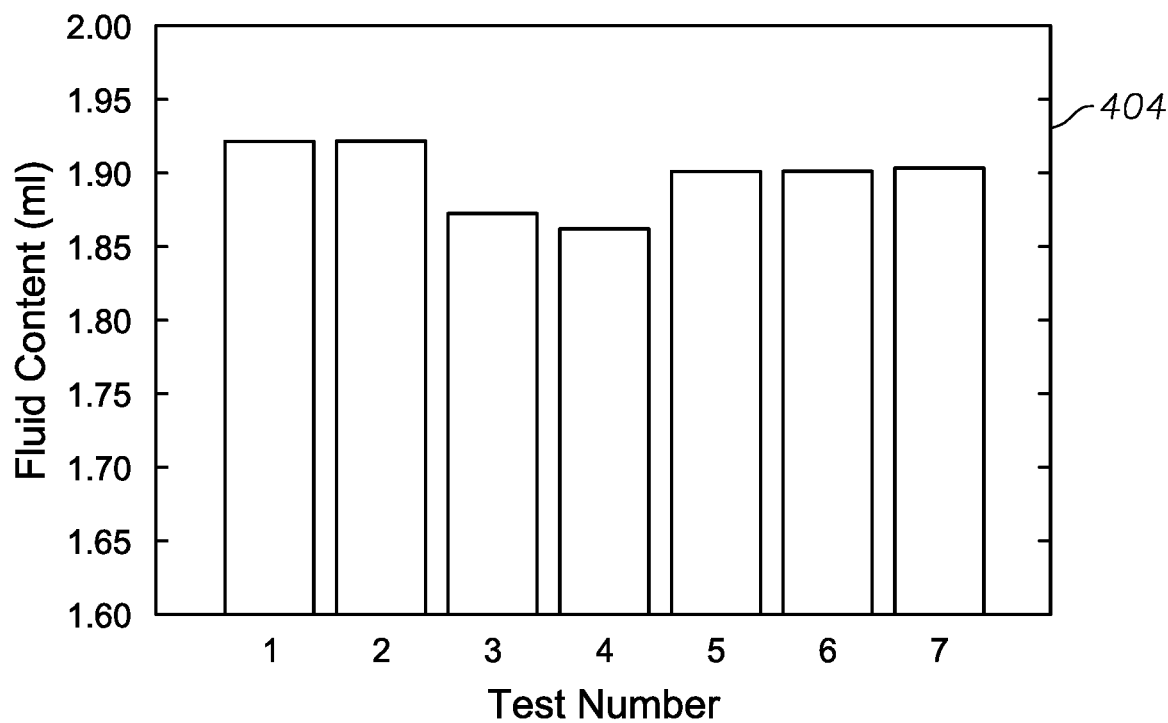

The same measurements were repeated seven times and plotted in FIG. 4A using external standard method and FIG. 4B using internal standard method. The largest measurement error is 3% using internal standard method. In contrast, it is slightly more than 10% when external standard method is used. For example, FIGS. 4A and 4B illustrate total fluid content 402, 404 in the shale sample using external (FIG. 4A) and internal (FIG. 4B) standard from seven different measurements on the same formation sample and standard sample, according to some example embodiments of the disclosure.

Figure 5:
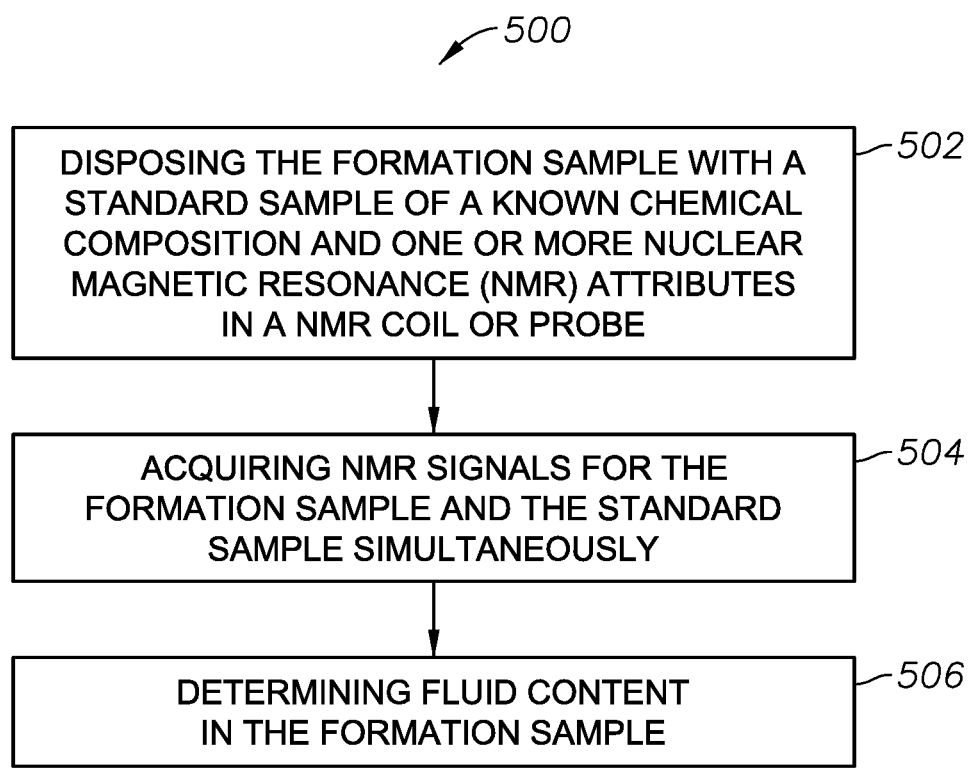
FIG. 5 illustrates example steps in a method for determining fluid content in a formation sample using low field nuclear magnetic resonance, according to one example embodiment of the disclosure.

FIG. 5 illustrates example steps in a method 500 for determining fluid content in a formation sample using low field nuclear magnetic resonance, according to one example embodiment of the disclosure. The method includes (502) disposing the formation sample with a standard sample of a known chemical composition and one or more nuclear magnetic resonance (NMR) attributes in a NMR coil or probe. The method further includes (504) acquiring NMR signals for the formation sample and the standard sample simultaneously. The method further includes (506) determining fluid content in the formation sample ($V_r$) using the formula:

$$V_r = \frac{V_{st}}{M_{st}} M_r \quad (3)$$

where $M_{st}$ is the NMR signal of the standard sample with known fluid volume ($V_{st}$) and $M_r$ is the NMR signal of the formation sample. According one embodiment, the NMR attributes of the standard sample may be distinct but not too far from the NMR attributes of the formation sample. The standard sample may be prepared with different relaxation times by dissolving different amounts of paramagnetic relaxation agents into water. The amount of fluid in the standard sample may be comparable in intensity to the largest peak in the formation sample. During NMR signal acquisition, the inter-scan delay is long enough so that formation sample and the standard sample have established equilibrium before each scan.

Computer Readable Medium

Figure 6:
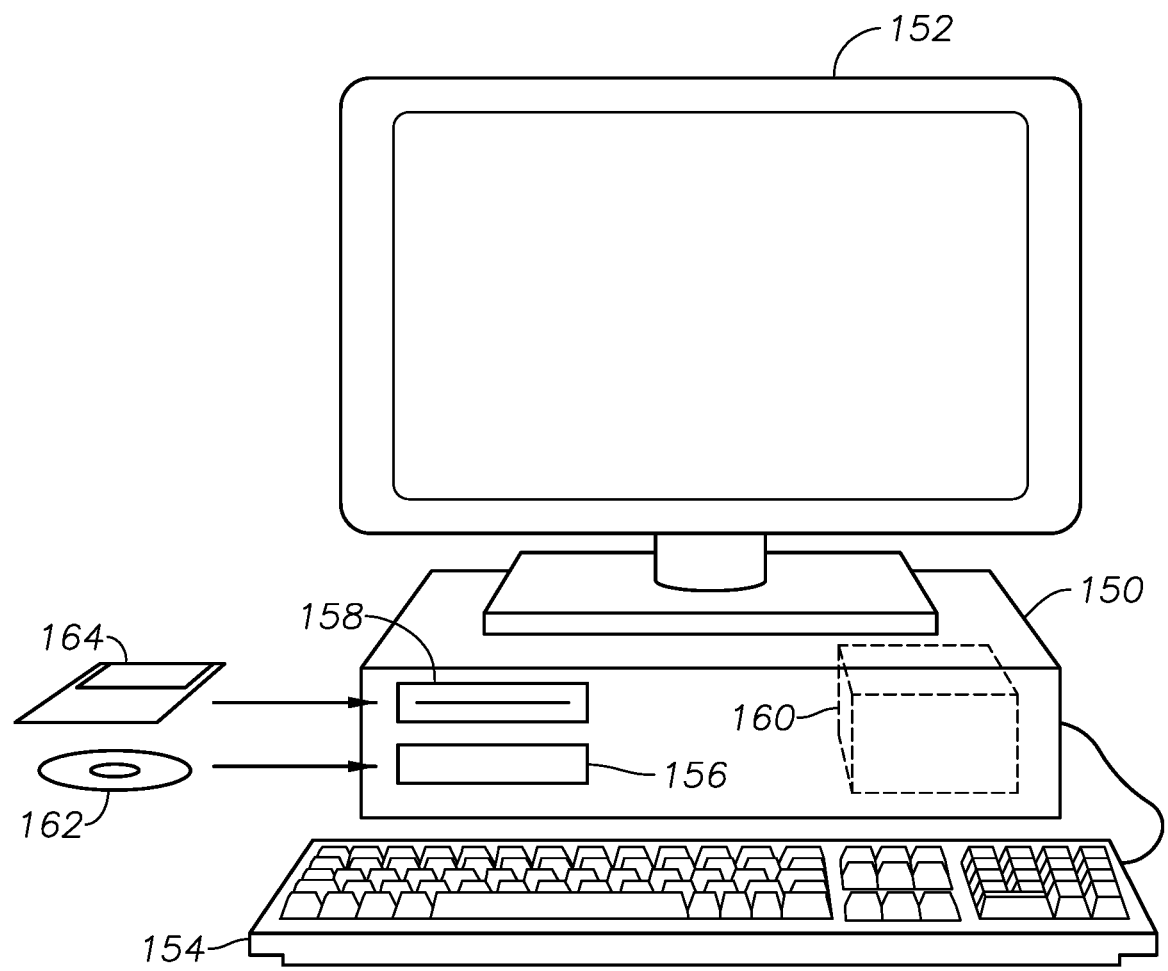
FIG. 6 is an example computer set up for determining fluid content in a formation sample using low field nuclear magnetic resonance, according to some example embodiments of the disclosure.

FIG. 6 is an example computer set up for determining fluid content in a formation sample using low field nuclear magnetic resonance, according to some example embodiments of the disclosure. Another example embodiment relates to computer programs stored in computer readable media. Referring to FIG. 6, the foregoing process as explained with reference to FIGS. 1-5 can be embodied in computer-readable code. The code can be stored on, e.g., a non-transitory computer readable medium, such as a floppy disk 164, CD-ROM 162, which may be read by disk drives 156, 158, or a magnetic (or other type) hard drive 160 forming part of a general purpose programmable computer. The computer, as known in the art, includes a central processing unit 150, a user input device such as a keyboard 154, and a user display 152 such as a flat panel LCD display or cathode ray tube display. According to this embodiment, the computer readable medium 160, 162, 164 includes logic operable to trigger the computer to execute acts as set forth above and explained with respect to the previous figures. The non-transitory computer-readable medium 160, 162, 164 may have, for example, computer executable instructions that trigger the computer to perform the operations of acquiring NMR signals for the formation sample and the standard sample simultaneously. The method further includes determining fluid content in the formation sample ($V_r$) using the formula:

$$V_r = \frac{V_{st}}{M_{st}} M_r$$

where $M_{st}$ is the NMR signal of the standard sample with known fluid volume ($V_{st}$) and $M_r$ is the NMR signal of the formation sample. According one embodiment, the NMR attributes of the standard sample may be distinct but not too far from the NMR attributes of the formation sample. The standard sample may be prepared with different relaxation times by dissolving different amounts of paramagnetic relaxation agents into water. The amount of fluid in the standard sample may be comparable in intensity to the largest peak in the formation sample. During NMR signal acquisition, the inter-scan delay is long enough so that formation sample and the standard sample have established equilibrium before each scan.

While the preceding examples demonstrate the application of the methods of the invention within the laboratory, it is envisaged that the methods would also be usefully applicable outside the laboratory, e.g. in an oil field, where the measurement of porosity and/or changes therein when the measurement conditions are not strictly conformant to the calibration condition would be desirable.

For instance, experiments could be carried out in the field in which downhole NMR logging may be used to obtain wettability data in the region of a hydrocarbon-bearing formation around a wellbore. NMR data for the bulk water phase may be obtained in the field using downhole NMR logging of an underlying aquifer that is in hydraulic communication with the hydrocarbon-bearing formation. NMR data for the bulk oil phase may be obtained using a sample of crude that has been produced from the hydrocarbon-bearing formation.

It may be necessary to work out the original oil saturation as a base for calculating an estimate of the amount of oil in place within a formation. Also, a saturation profile may be required. It is envisaged that it would also be possible to assess the extent of any changes in the wettability characteristics of and/or damage to a given formation that may be caused by the drilling process using NMR.

It will be appreciated that Proton NMR may be particularly well suited for studies of porous media containing therein fluids comprising water and hydrocarbon phases. However, it is anticipated that other modes of NMR may be useful for investigating other mixed phase fluid systems in porous media and that the principles of this invention may be applicable when using such other modes of NMR spectroscopy.

The Specification, which includes the Summary, Brief Description of the Drawings and the Detailed Description, and the appended Claims refer to particular features (including process or method steps) of the disclosure. Those of skill in the art understand that the invention includes all possible combinations and uses of particular features described in the Specification. Those of skill in the art understand that the disclosure is not limited to or by the description of embodiments given in the Specification.

Those of skill in the art also understand that the terminology used for describing particular embodiments does not limit the scope or breadth of the disclosure. In interpreting the Specification and appended Claims, all terms should be interpreted in the broadest possible manner consistent with the context of each term. All technical and scientific terms used in the Specification and appended Claims have the same meaning as commonly understood by one of ordinary skill in the art to which this invention belongs unless defined otherwise.

As used in the Specification and appended Claims, the singular forms "a," "an," and "the" include plural references unless the context clearly indicates otherwise. The verb "comprises" and its conjugated forms should be interpreted as referring to elements, components or steps in a non-exclusive manner. The referenced elements, components or steps may be present, utilized or combined with other elements, components or steps not expressly referenced. The verb "couple" and its conjugated forms means to complete any type of required junction, including electrical, mechanical or fluid, to form a singular object from two or more previously non-joined objects. If a first device couples to a second device, the connection can occur either directly or through a common connector. "Optionally" and its various forms means that the subsequently described event or circumstance may or may not occur. The description includes instances where the event or circumstance occurs and instances where it does not occur.

While there have been shown, described and pointed out, fundamental novel features of the invention as applied to the exemplary embodiments thereof, it will be understood that various omissions and substitutions and changes in the form and details of devices illustrated, and in their operation, may be made by those skilled in the art without departing from the spirit of the invention. Moreover, it is expressly intended that all combinations of those elements and/or method operations, which perform substantially the same function in substantially the same way to achieve the same results, are within the scope of the disclosure. Moreover, it should be recognized that structures and/or elements and/or method operations shown and/or described in connection with any disclosed form or embodiment of the disclosure may be incorporated in any other disclosed or described or suggested form or embodiment as a general matter of design choice. It is the intention, therefore, to be limited only as indicated by the scope of the claims appended hereto.

Although only a few examples have been described in detail above, those skilled in the art will readily appreciate that many modifications are possible in the examples without materially departing from this subject disclosure. Accordingly, all such modifications are intended to be included within the scope of this disclosure as defined in the following claims. In the claims, means-plus-function clauses are intended to cover the structures described as performing the recited function and not only structural equivalents, but also equivalent structures.

The invention claimed is:

1. A method for determining fluid content in a formation sample, the method comprising:
    disposing the formation sample with a standard sample of a known chemical composition and one or more nuclear magnetic resonance (NMR) attributes in a NMR coil or probe;
    acquiring NMR signals for the formation sample and the standard sample simultaneously; and
    determining fluid content in the formation sample ($V_r$) using the formula:

$$V_r = \frac{V_{st}}{M_{st}} M_r$$

where $M_{st}$ is the NMR signal of the standard sample with known fluid volume ($V_{st}$) and $M_r$ is the NMR signal of the formation sample.

2. The method of claim 1, wherein the NMR attributes of the standard sample are distinct but not too far from the NMR attributes of the formation sample.

3. The method of claim 1, wherein the standard sample is prepared with different relaxation times by dissolving different amounts of paramagnetic relaxation agents into water or another fluid.

4. The method of claim 1, wherein the amount of fluid in the standard sample is comparable in intensity to the largest peak in the formation sample.

5. The method of claim 1, wherein during NMR signal acquisition, the inter-scan delay is properly selected so that both formation sample and the standard sample have established equilibrium before each scan.

6. A system for determining fluid content in a formation sample, the system comprising:
    a NMR probe or NMR coil;
    a formation sample; and
    a standard sample with known chemical composition and one or more nuclear magnetic resonance (NMR) attributes,
    wherein the formation sample and the standard sample are disposed in the NMR coil or probe;
    wherein NMR signals are acquired for the formation sample and the standard sample simultaneously; and
    wherein the fluid content in the formation sample ($V_r$) is determined using the formula:

$$V_r = \frac{V_{st}}{M_{st}} M_r$$

where $M_{st}$ is the NMR signal of the standard sample with known fluid volume ($V_{st}$) and $M_r$ is the NMR signal of the formation sample.

7. The system of claim 6, wherein the NMR attributes of the standard sample are distinct but not too far from the NMR attributes of the formation sample.

8. The system of claim 6, wherein the standard sample is prepared with different relaxation times by dissolving different amounts of paramagnetic relaxation agents into water or another fluid.

9. The system of claim 6, wherein the amount of fluid in the standard sample is comparable in intensity to the largest peak in the formation sample.

10. The system of claim 6, wherein during NMR signal acquisition, the inter-scan delay is properly selected so that both formation sample and the standard sample have established equilibrium before each scan.

* * * * *